(12) United States Patent  
Kuwahara

(10) Patent No.: US 10,134,609 B2  
(45) Date of Patent: Nov. 20, 2018

(54) SUBSTRATE TRANSPORTING DEVICE, SUBSTRATE TREATING APPARATUS, AND SUBSTRATE TRANSPORTING METHOD

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 58 days.

(21) Appl. No.: 15/077,310

(22) Filed: Mar. 22, 2016

(65) Prior Publication Data

US 2016/0293465 A1    Oct. 6, 2016

(30) Foreign Application Priority Data

Mar. 31, 2015  (JP) ................................ 2015-072182

(51) Int. Cl.
*H01L 21/67* (2006.01)
*H01L 21/677* (2006.01)

(52) U.S. Cl.
CPC .. *H01L 21/67017* (2013.01); *H01L 21/67766* (2013.01); *H01L 21/67778* (2013.01)

(58) Field of Classification Search
CPC ................... H01L 21/67017; H01L 21/67766
USPC .................. 414/217, 939; 454/187
See application file for complete search history.

(56) References Cited

U.S. PATENT DOCUMENTS

| 6,426,303 | B1 | 7/2002 | Ueda ............................ 438/716 |
| 7,438,514 | B2 * | 10/2008 | Lee .................... H01L 21/67017 |
| | | | 414/217 |
| 2009/0081005 | A1 | 3/2009 | Miyasaka ..................... 414/217 |
| 2011/0070055 | A1 | 3/2011 | Sasaki et al. .............. 414/217.1 |

(Continued)

FOREIGN PATENT DOCUMENTS

| JP | 09-320915 A | 12/1997 |
| JP | 2001-093827 | 4/2001 |

(Continued)

OTHER PUBLICATIONS

Office Action and Search Report dated Mar. 28, 2017 in corresponding Taiwan Patent Application No. 105109834.

(Continued)

*Primary Examiner* — James Keenan
(74) *Attorney, Agent, or Firm* — Ostrolenk Faber LLP

(57) ABSTRACT

Disclosed is a substrate transporting device including a transport mechanism, a transport chamber, a first exhaust fan, and a controller. The transport mechanism is movable in parallel in a given direction. The transport chamber includes a first wall disposed on a first side of the given direction of the transport mechanism, and a plurality of transportation ports each used for moving the substrate between an exterior and an interior of the transport chamber. The first exhaust fan is disposed closer to the first wall than any of the transportation ports, and exhausts gas in the transport chamber outside the transport chamber. The controller performs control such that, when the transport mechanism moves toward the first wall in a first proximal area whose distance from the (Continued)

first wall is of a given value or less, an exhaust amount of the first exhaust fan is larger than that when the transport mechanism moves toward the first wall out of the first proximal area.

27 Claims, 6 Drawing Sheets

(56) References Cited

U.S. PATENT DOCUMENTS

| | | | |
|---|---|---|---|
| 2011/0087378 A1* | 4/2011 | Kim | H01L 21/67017 700/282 |
| 2012/0144938 A1* | 6/2012 | Inagaki | H01L 21/67017 73/865.8 |
| 2013/0251493 A1 | 9/2013 | Zhu et al. | 414/788.1 |
| 2015/0125238 A1 | 5/2015 | Hiroki et al. | 414/217.1 |

FOREIGN PATENT DOCUMENTS

| | | |
|---|---|---|
| JP | 2001-284426 A | 10/2001 |
| JP | 2009-076805 | 4/2009 |
| JP | 2010-272828 A | 12/2010 |
| JP | 2012-096906 A | 5/2012 |
| JP | 2012-116647 A | 6/2012 |
| TW | 201025486 A | 7/2010 |
| TW | 201339073 A | 10/2013 |

OTHER PUBLICATIONS

English machine translation of TW 201025486 A previously cited in the IDS filed Jun. 16, 2017.

English machine translation of JP 2001-284426 A previously cited in the IDS filed Jun. 16, 2017.

* cited by examiner

| MODE | SUPPLY AMOUNT OF GAS SUPPLY FAN 43 | EXHAUST AMOUNT OF FIRST EXHAUST FAN 41 | POSITION AND MOVEMENT DIRECTION OF TRANSPORT MECHANISM 17 X(+) ↔ X(-) | | EXHAUST AMOUNT OF SECOND EXHAUST FAN 42 |
|---|---|---|---|---|---|
| | | | FIRST PROXIMAL AREA D1 | SECOND PROXIMAL AREA D2 | |
| M1 | Q3 | Q1L | | ←○ | Q2L |
| M2 | Q3 | Q1L | ←○ | | Q2L |
| M3 | Q3 | Q1H | ←○ | | Q2L |
| M4 | Q3 | Q1L | ○ | | Q2L |
| M5 | Q3 | Q1L | ○→ | | Q2L |
| M6 | Q3 | Q1L | ○→ | | Q2L |
| M7 | Q3 | Q1L | | ○→ | Q2H |
| M8 | Q3 | Q1L | | ○ | Q2L |
| M9 | Q3 | Q1L | ○ | | Q2L |

Q1H > Q1L, Q2H > Q2L

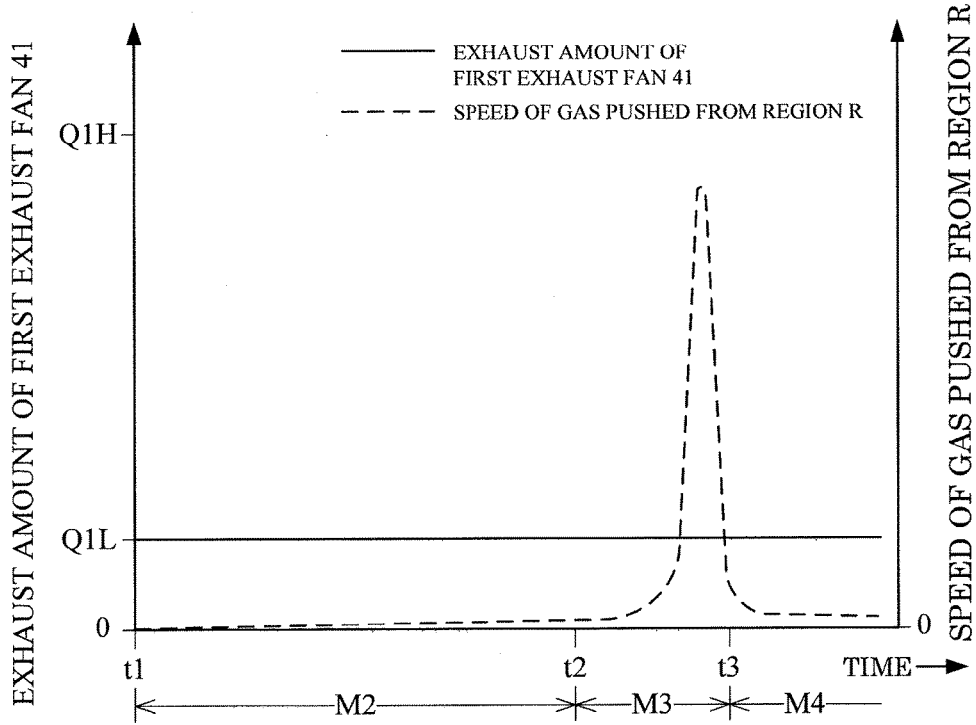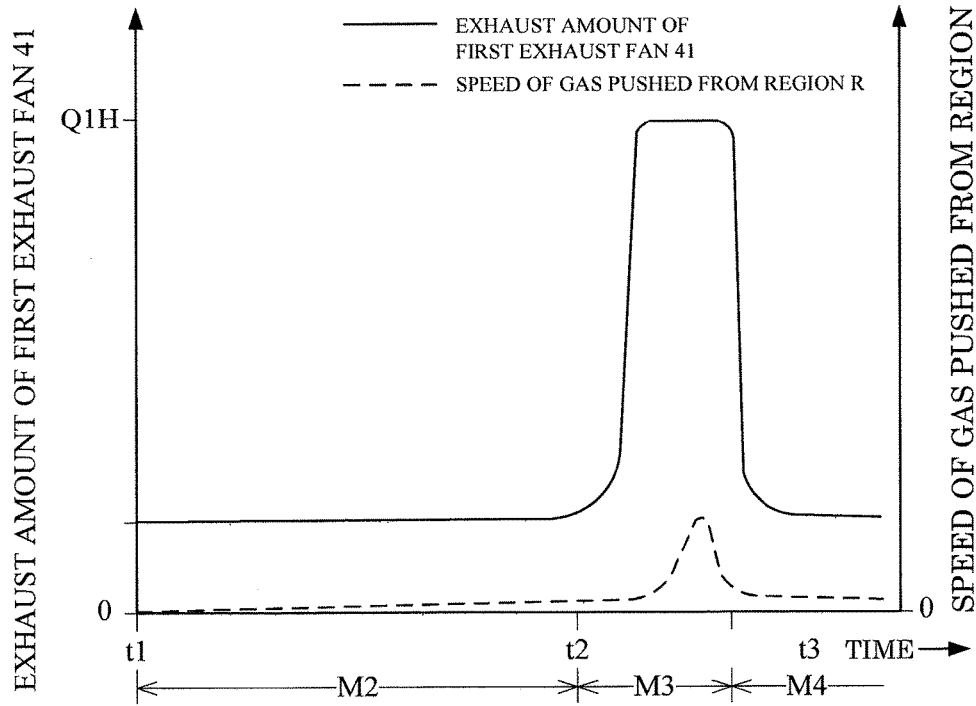

| MODE | | M11 | M12 | M13 | M14 | M15 | M16 |
|---|---|---|---|---|---|---|---|
| SUPPLY AMOUNT OF GAS SUPPLY FAN 43 | | Q3 | | | | | |
| POSITION AND MOVEMENT DIRECTION OF TRANSPORT MECHANISM 57 Z(+) ↕ Z(−) | | ○↓ | | | | ○↑ | ○ |
| | FIRST PROXIMAL AREA D1 | | ○↓ | ○ | ○↑ | | |
| EXHAUST AMOUNT OF FIRST EXHAUST FAN 41 | | Q1L | Q1H | Q1L | | | |

SUBSTRATE TRANSPORTING DEVICE, SUBSTRATE TREATING APPARATUS, AND SUBSTRATE TRANSPORTING METHOD

CROSS-REFERENCE TO RELATED APPLICATIONS

This application claims priority to Japanese Patent Application No. 2015-072182 filed Mar. 31, 2015, the disclosure of which is hereby incorporated herein by reference in its entirety for all purposes.

BACKGROUND OF THE INVENTION

1. Field of the Invention

The present invention relates to a substrate transporting device for transporting a substrate such as a semiconductor wafer, a glass substrate for photomask, a glass substrate for liquid crystal display, an optical disk substrate, and the like (hereinafter, simply referred to as a "substrate"), a substrate treating apparatus provided with the substrate transporting device for treating the substrate, and a substrate transporting method for transporting the substrate.

2. Description of the Related Art

Japanese Unexamined Patent Publication No. 2001-93827A discloses a plurality of transporting devices, a fan filter unit, an exhaust fan, and a controller. The transporting devices are each movable vertically. The fan filter unit is disposed above the transporting devices. The exhaust fan is disposed below the transporting devices. The controller controls the exhaust fan. When the transporting devices are moved downward simultaneously, turbulent airflow is generated. At this time, the controller performs control to increase an exhaust amount of the exhaust fan for enhancing downflow of clean air. The enhanced downflow absorbs the turbulent airflow. This prevents particles from entering into treatment units.

Japanese Unexamined Patent Publication No. 2009-076805A discloses a transport chamber, a transport mechanism, a gas supply fan, a gas supply valve, an exhaust fan, an exhaust valve, and a controller. The transport mechanism is disposed in the transport chamber so as to be movable vertically. The gas supply fan and the gas supply valve each supply gas to the transport chamber. The exhaust fan and the exhaust valve each exhaust gas from the transport chamber. The controller controls the gas supply fan, the gas supply valve, the exhaust fan and exhaust valve for adjusting a speed of downflow in the transport chamber. When the transport mechanism moves the substrate downward, the controller performs control such that a rate of downflow is higher than a speed at which the substrate is moved downward. Since the downflow is faster than the speed at which the substrate is moved downward, the downflow is supplied to a surface of the downward-moving substrate. Accordingly, this prevents particles from adhering to the surface of the substrate.

However, the example of the currently-used apparatus with such constructions has the following drawback. That is, even the currently-used example may achieve insufficient suppression of floating particles.

SUMMARY OF THE INVENTION

The present invention has been made regarding the state of the art noted above, and its one object is to provide a substrate transporting device, a substrate treating apparatus, and a substrate transporting method that allow satisfactory suppression of floating particles.

An Inventor has attained a finding that floating particles are likely to occur at an end face of the transport chamber rather than the center of the transport chamber. Moreover, the Inventor has attained another finding that particles readily flow to the outside of the transport chamber through transportation ports at the end face of the transport chamber. The transportation ports are each an opening used for moving the substrate to the inside/outside of the transport chamber. The transport chamber is connected to a substrate container that accommodates the substrate, a treating unit that treats the substrate and other transport chambers via the transporting ports. If the particles flow into the substrate container from the transport chamber, the substrate container has difficulty in protecting the substrate suitably. Moreover, if the particles enter from the transport chamber into the treating unit and/or the other transport chambers, the treating unit and/or the other transport chambers have difficulty in high-quality treatment or transport of the substrate.

A first aspect of the present invention provides a substrate transporting device. The substrate transporting device includes a transport mechanism that is movable in parallel in a given direction and transports a substrate, and a transport chamber that accommodates the transport mechanism. The transport chamber includes a first wall disposed in a first side of the given direction relative to the transport mechanism, and a plurality of transportation ports each used for moving the substrate between an exterior and an interior of the transport chamber. The substrate transporting device includes a first exhaust unit that is disposed closer to the first wall than any of the transportation ports, and exhausts gas in the transport chamber outside the transport chamber, and a controller that controls the transport mechanism and the first exhaust unit. The controller performs control such that, when the transport mechanism moves toward the first wall in a first proximal area whose distance from the first wall is of a given value or less, an exhaust amount of the first exhaust unit is larger than that when the transport mechanism moves toward the first wall out of the first proximal area.

The first wall is separated from the transport mechanism in the first side of the given direction. The first exhaust unit is disposed closer to the first wall than any of the transportation ports. Consequently, the first exhaust unit can exhaust gas at a position closer to the first wall than any of the transportation ports to the exterior of the transport chamber.

When the transport mechanism moves toward the first wall in the first proximal area, the controller performs control such that the exhaust amount of the first exhaust unit becomes relatively large. That is, when the transport mechanism approaches the first wall in the first proximal area, the exhaust amount of the first exhaust unit is relatively large. This allows the gas pushed by the transport mechanism against to the first wall to escape outside the transport chamber efficiently. Consequently, a speed of the gas pushed out from a region between the transport mechanism and the first wall to the other region in the transport chamber can be relieved suitably. As a result, this allows suitable suppression of floating particles in the transport chamber. Especially, the first exhaust unit is disposed closer to the first wall than any of the transportation ports. This allows suitable suppression of floating particles around any of the transportation ports. Consequently, the particles in the transport chamber are prevented from flowing outside the transport chamber through the transportation ports.

On the other hand, when the transport mechanism moves toward the first wall outside the first proximal area, the controller performs control such that an exhaust amount of the first exhaust unit becomes relatively small. That is, when the transport mechanism approaches the first wall outside the first proximal area, the exhaust amount of the first exhaust unit is relatively small. This allows more effective reduction in consumption energy of the first exhaust unit while the floating particles are suppressed.

It is preferred in the first aspect of the present invention that the first exhaust unit exhausts at least an amount of gas pushed out by the transport mechanism when the transport mechanism moves toward the first wall in the first proximal area. That is, it is preferred that the amount of gas exhausted by the first exhaust unit is equal to or more than that pushed out against the first wall by the transport mechanism when the transport mechanism approaches the first wall in the first proximal area. Almost all the amount of gas, pushed against the first wall by the transport mechanism, can escape from the first exhaust unit outside the transport chamber. This allows more efficient suppression of floating particles in the transport chamber.

It is preferred in the first aspect of the present invention that the first exhaust unit is disposed on the first wall, and is disposed lower in level than the transportation ports. Since the first exhaust unit is disposed on the first wall, the gas pushed against the first wall by the transport mechanism can be suitably exhausted outside the transport chamber. Moreover, since the first exhaust unit is disposed lower in level than any of the transportation ports, the first exhaust unit allows exhaust of the gas while no particle floats adjacent to the transportation ports.

It is preferred in the first aspect of the present invention that the first proximal area is defined so as to contain the transport mechanism that transports the substrate to one of the transportation ports that is the closest to the first wall, and so as not to contain the transport mechanism that transports the substrate to the transportation ports other than the transportation port that is the closest to the first wall. Accordingly, effective reduction in consumption energy of the first exhaust unit is obtainable while floating particles are satisfactorily suppressed.

It is preferred in the first aspect of the present invention that the controller performs control such that the transport chamber has a positive pressure also when the transport mechanism moves toward the first wall in the first proximal area. More specifically, it is preferred that the exhaust amount of the first exhaust unit is controlled such that the transport chamber has a positive pressure when the transport mechanism approaches the first wall in the first proximal area. Consequently, this prevents gas with a low degree of cleanness from entering into the transport chamber from outside the transport chamber, leading to sufficient suppression of floating particles.

It is preferred in the first aspect of the present invention that the substrate transporting device further includes a gas supply unit that supplies gas to the transport chamber. The controller controls the gas supply unit. The controller performs control such that an exhaust amount of the first exhaust unit is smaller than a supply amount of the gas supply unit also when the transport mechanism moves toward the first wall in the first proximal area. The transport chamber allows maintenance of the positive pressure even when the transport mechanism approaches the first wall in the first proximal area. As a result, this prevents a low degree of cleanness of gas from entering into the transport chamber from outside the transport chamber, leading to more efficient suppression of floating particles.

The following is preferred in the first aspect of the present invention. That is, the transport chamber includes a second wall disposed in a second side of the given direction relative to the transport mechanism. The substrate transporting device includes a second exhaust unit that is disposed closer to the second wall than any of the transportation ports, and exhausts gas in the transport chamber outside the transport chamber. The controller controls the second exhaust unit. The controller performs control such that, when the transport mechanism moves toward the second wall in a second proximal area whose distance from the second wall is of a given value or less, an exhaust amount of the second exhaust unit is larger than that when the transport mechanism moves toward the second wall out of the second proximal area. The second wall is separated from the transport mechanism in the second side of the given direction. When the transport mechanism approaches the second wall in the second proximal area, the exhaust amount of the second exhaust unit is relatively large. This allows the gas pushed against the second wall by the transport mechanism to escape outside the transport chamber efficiently. Consequently, air pushed out from the area between the transport mechanism and the second wall to the other area in the transport chamber allows suitable prevention of floating particles. Especially, the second exhaust unit is disposed closer to the second wall than any of the transportation ports. This allows suitable suppression of floating particles around any of the transportation ports. Consequently, the particles in the transport chamber are prevented from flowing outside the transport chamber through the transportation ports. Moreover, when the transport mechanism approaches the second wall outside the second proximal area, effective reduction in consumption energy of the second exhaust unit is obtainable while floating particles are satisfactorily suppressed.

It is preferred in the first aspect of the present invention that the second exhaust unit exhausts at least an amount of gas pushed out by the transport mechanism when the transport mechanism moves toward the second wall in the second proximal area. That is, it is preferred that the amount of gas exhausted by the second exhaust unit is equal to or more than that pushed against the second wall by the transport mechanism when the transport mechanism approaches the second wall in the second proximal area. Almost all the amount of gas, pushed against the second wall by the transport mechanism, can escape from the second exhaust unit outside the transport chamber. This allows more efficient suppression of floating particles in the transport chamber.

It is preferred in the first aspect of the present invention that the second exhaust unit is disposed on the second wall, and is disposed lower in level than the transportation ports. Since the second exhaust unit is disposed on the second wall, the gas pushed by the transport mechanism against the second wall can be suitably exhausted outside the transport chamber. Moreover, since the second exhaust unit is disposed lower in level than any of the transportation ports, the second exhaust unit allows exhaust of the gas while no particle floats adjacent to the transportation ports.

It is preferred in the first aspect of the present invention that the second proximal area is defined so as to contain the transport mechanism that transports the substrate to one of the transportation ports that is the closest to the second wall, and so as not to contain the transport mechanism that transports the substrate to the transportation ports other than the transportation port that is the closest to the second wall.

Accordingly, effective reduction in consumption energy of the second exhaust unit is obtainable while floating particles are satisfactorily suppressed.

It is preferred in the first aspect of the present invention that the controller performs control such that the transport chamber has a positive pressure also when the transport mechanism moves toward the second wall in the second proximal area. More specifically, it is preferred that the exhaust amount of the second exhaust unit is controlled such that the transport chamber has a positive pressure when the transport mechanism approaches the second wall in the second proximal area. Consequently, this prevents gas with a low degree of cleanness from entering into the transport chamber from outside the transport chamber, leading to sufficient suppression of floating particles.

It is preferred in the first aspect of the present invention that the substrate transporting device further includes a gas supply unit that supplies gas to the transport chamber. The controller controls the gas supply unit. The controller performs control such that the sum of an exhaust amount of the first exhaust unit and an exhaust amount of the second exhaust unit is smaller than a supply amount of the gas supply unit also when the transport mechanism moves toward the second wall in the second proximal area. The transport chamber allows maintenance of the positive pressure even when the transport mechanism approaches the second wall in the second proximal area. As a result, this prevents a low degree of cleanness of gas from entering into the transport chamber from outside the transport chamber, leading to more efficient suppression of floating particles.

It is preferred in the first aspect of the present invention that the controller performs control such that the exhaust amount of the second exhaust unit is smaller than a supply amount of the gas supply unit also when the transport mechanism moves toward the second wall in the second proximal area. The transport chamber allows maintenance of the positive pressure even when the transport mechanism approaches the second wall in the second proximal area. As a result, this prevents a low degree of cleanness of gas from entering into the transport chamber from outside the transport chamber, leading to more efficient suppression of floating particles.

It is preferred in the first aspect of the present invention that the controller performs control such that the exhaust amount of the second exhaust unit is kept constant and the supply amount of the gas supply unit is kept constant when the transport mechanism moves toward the first wall. This allows suppression of consumption energy of the second exhaust unit and the gas supply unit.

It is preferred in the first aspect of the present invention that the given direction is a horizontal direction. This allows a suitable substrate transporting device with a transport mechanism that moves in parallel horizontally.

It is preferred in the first aspect of the present invention that the given direction is a vertical direction. This allows a suitable substrate transporting device with a transport mechanism that moves in parallel vertically.

It is preferred in the first aspect of the present invention that the transport chamber is disposed adjacent to a mount table that places a substrate container thereon that accommodates the substrates, and the transport mechanism transports the substrates individually to the substrate container placed on the mount table through the transportation ports. The substrate transporting device allows transportation of the substrates to and from the substrate container while suitably preventing particles from entering into the substrate container from the transport chamber.

A second aspect of the present invention provides a substrate treating apparatus. The substrate treating apparatus includes the substrate transporting device mentioned above, and a treating unit that performs treatment to the substrate.

The substrate treating apparatus according to the second aspect of the present invention allows suitable protection of the substrate from particles.

A third aspect of the present invention provides a substrate transporting method for moving a transport mechanism in parallel in a transport chamber, having a plurality of transportation ports formed therein, toward a first wall of the transport chamber. The substrate transporting method includes a first proximal approaching step of moving the transport mechanism toward the first wall in a first proximal area whose distance from the first wall is of a given value or less, and a first distal approaching step of moving the transport mechanism to the first wall out of the first proximal area. In the first proximal approaching step and the first distal approaching step, a first exhaust unit disposed closer to the first wall than any of the transportation ports exhausts gas in the transport chamber. An exhaust amount of the first exhaust unit is larger in the first proximal approaching step than that in the first distal approaching step.

The exhaust amount is relatively large in the first proximal approaching step. Consequently, a speed of the gas can be relieved suitably that are pushed from an area between the transport mechanism and the first wall to the other area in the transport chamber. Moreover, the first exhaust unit is disposed closer to the first wall than any of the transportation ports. Accordingly, this achieves suitable prevention of floating particles around any of the transportation ports.

In addition, the exhaust amount is relatively small in the first distal approaching step. This achieves more efficient reduction in consumption energy of the first exhaust unit while floating particles are suppressed.

For the purpose of illustrating the invention, there are shown in the drawings several forms which are presently preferred, it being understood, however, that the invention is not limited to the precise arrangement and instrumentalities shown.

Figure 7:
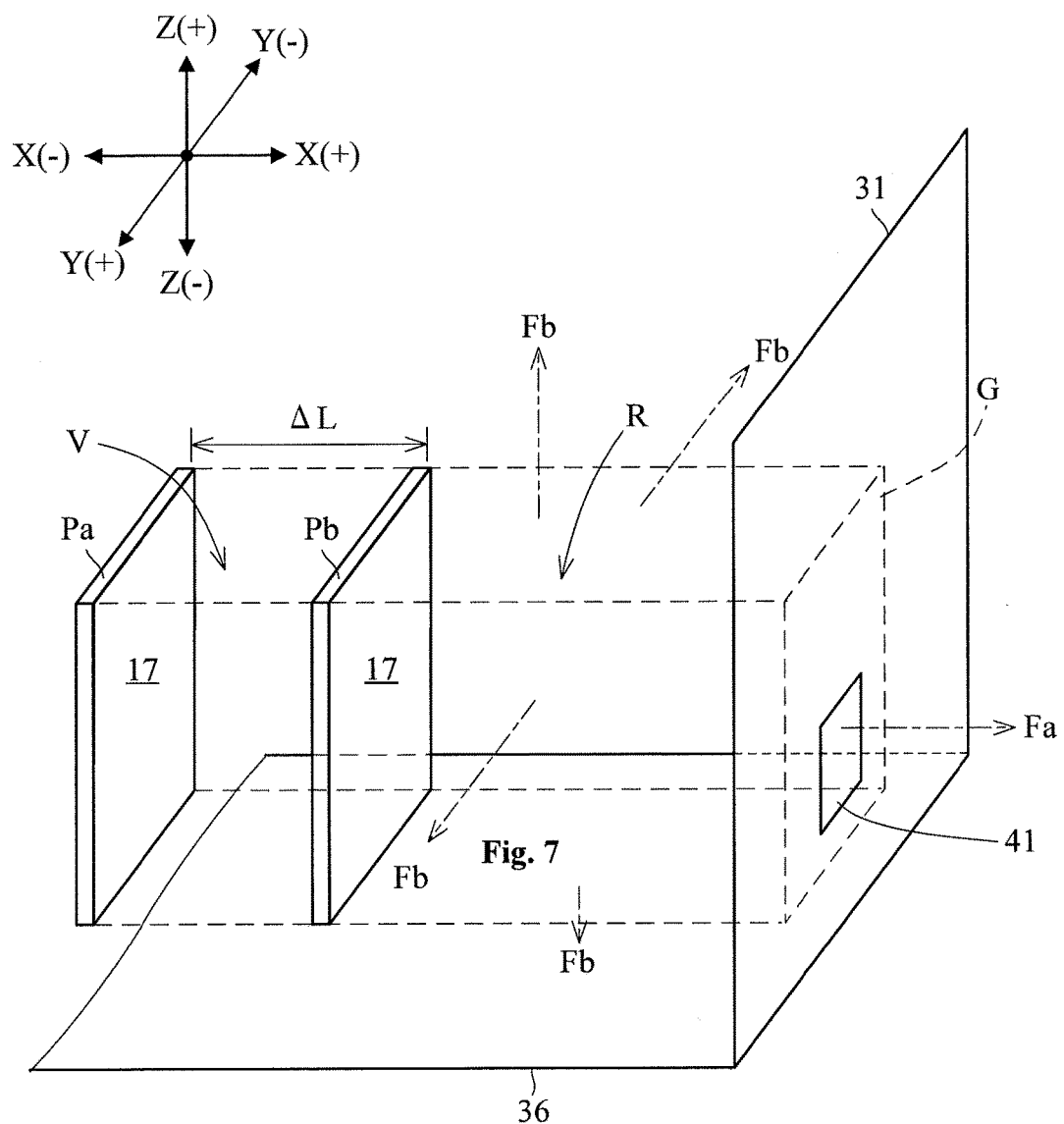

FIG. 7 schematically illustrates a relationship between movement of a transport mechanism and a gas flow.

FIG. 8A illustrates a speed of gas pushed out from an area in a comparative example. FIG. 8B illustrates a speed of gas pushed out from an area in the present embodiment.

Figures 9, 10:
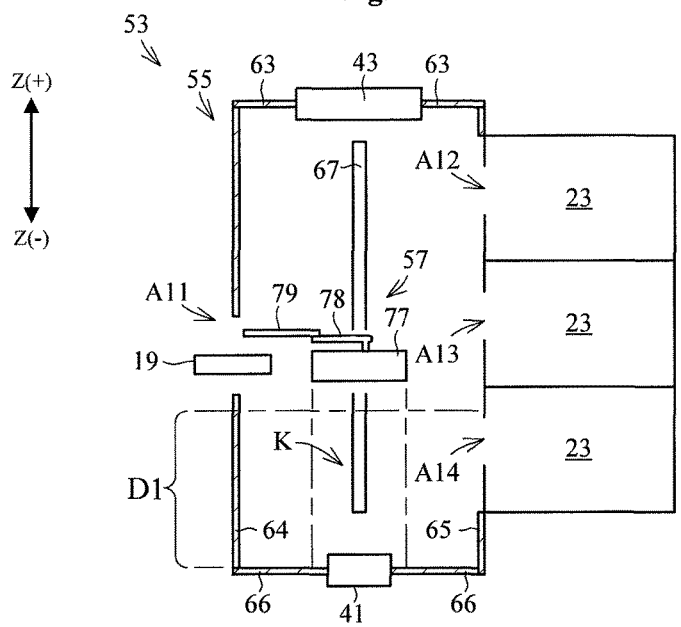

FIG. 9 illustrates a substrate transporting device according to one modification of the present invention.

FIG. 10 illustrates an exhaust amount of a first exhaust fan and a supply amount of a gas supply fan according to the modification.

DESCRIPTION OF THE PREFERRED EMBODIMENTS

Figure 1:
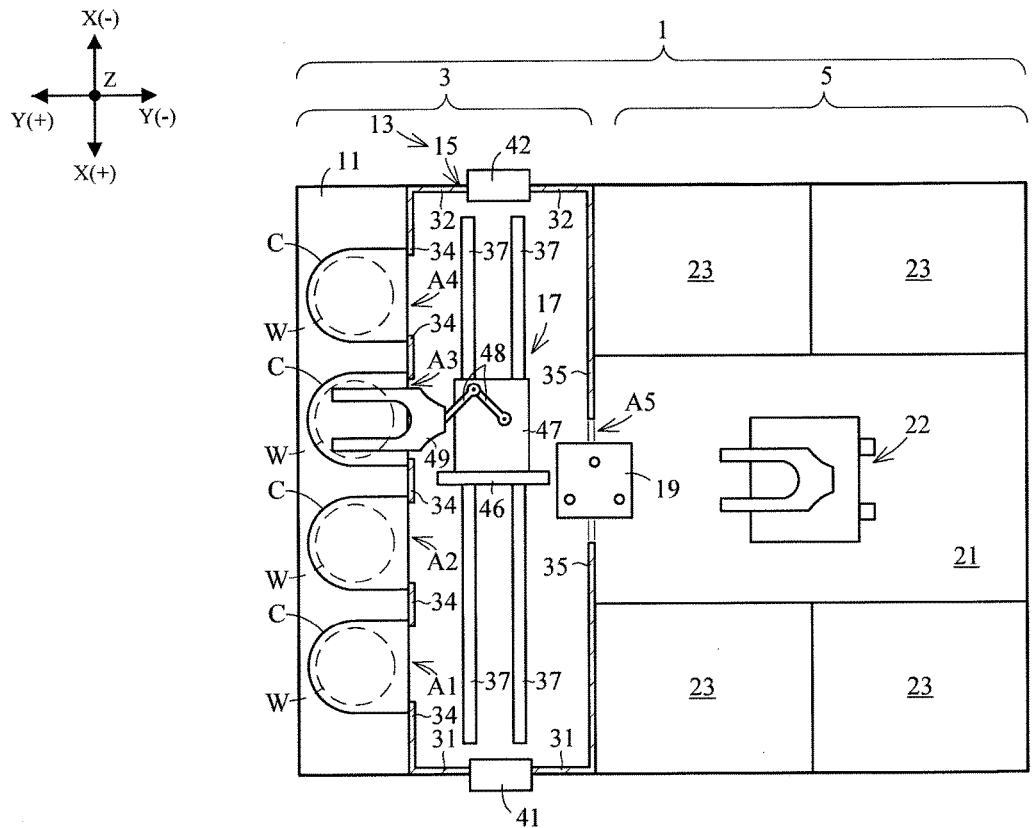
FIG. 1 is a plan view of a substrate transporting device and a substrate treating apparatus according to one embodiment of the present invention.

FIG. 1 is a plan view of a substrate transporting device and a substrate treating apparatus according to one embodiment of the present invention. In each drawing, symbols "X" and "Y" denote horizontal directions orthogonal to each other, and a symbol "Z" denotes a vertical direction (also referred to as a upward/downward direction).

The substrate treating apparatus 1 includes an indexer (hereinafter, referred to as an "ID section") 3 and a treating section 5. The ID section 3 and the treating section 5 are adjacent to each other.

The ID section 3 includes a mount table 11 and a substrate transporting device 13. The mount table 11 places a plurality of cassettes C in a horizontal direction X. The cassettes C each accommodate a plurality of substrates (e.g., semiconductor wafers) W. The substrate transporting device 13 transports a substrate W to the cassette C placed on the mount table 11. The substrate transporting device 13 includes a transport chamber 15 and a transport mechanism 17. The transport chamber 15 is disposed adjacent to the mount table 11. The transport mechanism 17 is accommodated in the transport chamber 15. The transport mechanism 17 is movable in parallel in the horizontal direction X (hereinafter, referred to as a "given direction X"). A receiver 19 is disposed between the substrate transport chamber 15 and the treating section 5 for placing the substrate W thereon. The transport mechanism 17 is accessible to the cassettes C placed on the mount table 11, and is accessible to the receiver 19. The cassette C is a non-limiting example of the substrate container in the present invention.

The treating section 5 includes a transport chamber 21 and a plurality of treating units 23. The transport chamber 21 includes a transport mechanism 22 for transporting the substrate W. The transport mechanism 22 is accessible to the receiver 19 and the treating units 23. The treating units 23 each perform treatment to the substrate W. The treatment to the substrate W may be a liquid treatment such as a cleaning treatment, a resist application treatment, and a developing process, or may be a heat treatment such as heating and cooling.

Figure 2:
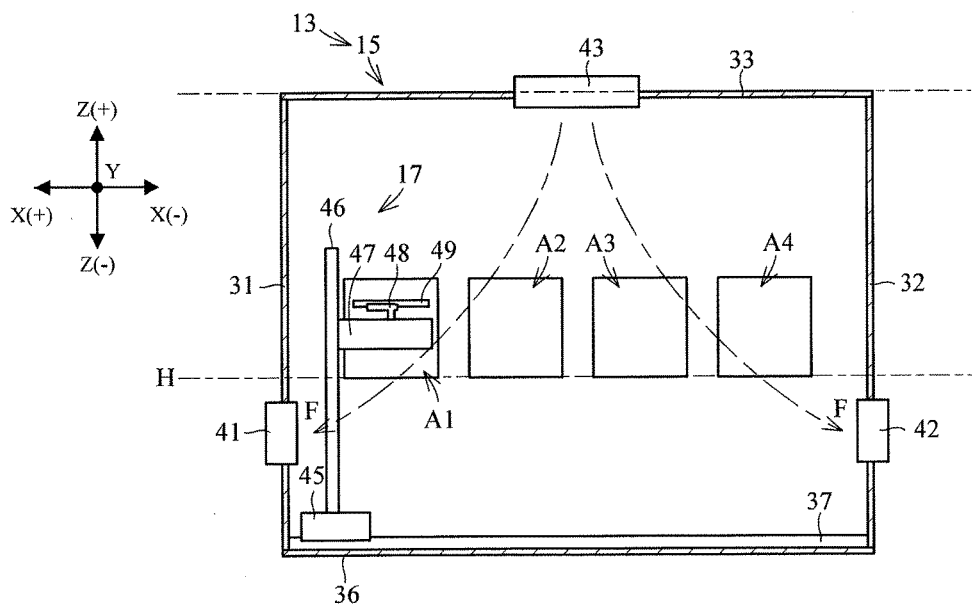
FIG. 2 illustrates an interior of the substrate transporting device seen from a treating section.
Figure 3:
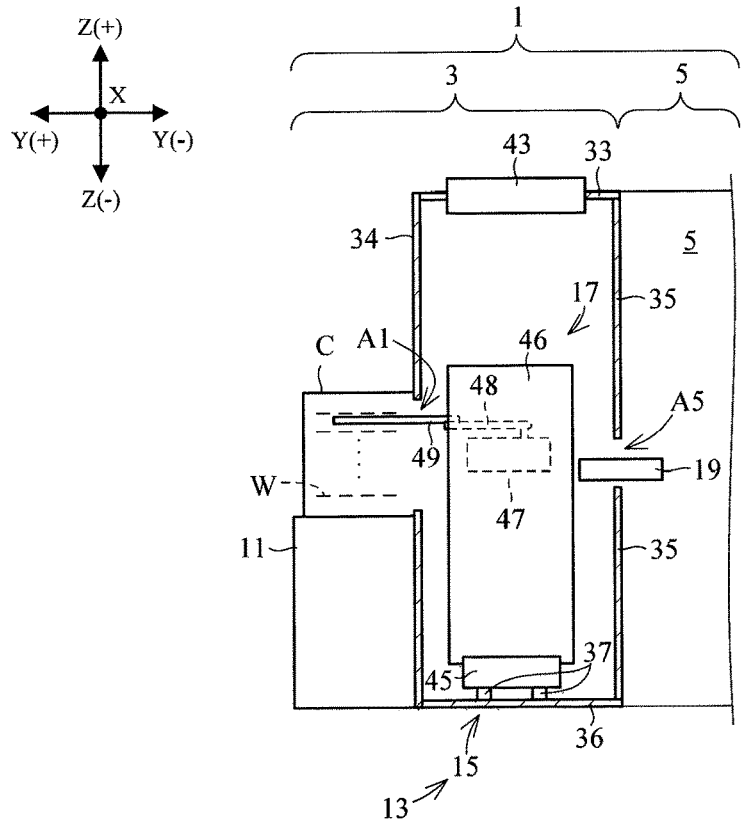
FIG. 3 is a side view of a mount table and a substrate transporting device.

Reference is now made to FIGS. 2 and 3 in addition to FIG. 1. FIG. 2 illustrates an interior of the substrate transporting device 13 seen from the treating section 5. FIG. 3 is a side view of the mount table and the substrate transporting device.

The transport chamber 15 includes a first wall 31, a second wall 32, and a ceiling 33. The first wall 31 is disposed on a first side of the given direction X (hereinafter, referred to as a "first direction X(+)") of the transport mechanism 17. That is, the first wall 31 is disposed in the first direction X(+) relative to the transport mechanism 17. The first wall 31 is separated from the transport mechanism 17 in the first direction X(+). The second wall 32 is disposed on a second side of the given direction X (hereinafter, referred to as an "second direction X(−)") of the transport mechanism 17. That is, the second wall 32 is disposed in the second direction X(−) relative to the transport mechanism 17. The second wall 32 is separated from the transport mechanism 17 in the second direction X(−). The ceiling 35 is disposed in an upward direction Z(+) of the transport mechanism 15.

The first wall 31 includes a first exhaust fan 41. The second wall 32 includes a second exhaust fan 42. The first exhaust fan 41 and the second exhaust fan 42 each exhaust gas in the transport chamber 15 outside the transport chamber 15. The first exhaust fan 41 is a non-limiting example of the first exhaust unit in the present invention. The second exhaust fan 42 is a non-limiting example of the second exhaust unit in the present invention.

The ceiling 33 includes a gas supply fan 43. The gas supply fan 43 supplies clean gas to the transport chamber 15.

FIG. 2 schematically illustrate a gas flow F supplied from the gas supply fan 43. The gas supply fan 43 is a non-limiting example of the gas supply unit in the present invention.

The transport chamber 15 further includes a front wall 34, a rear wall 35, and a floor 36. The front wall 34 is disposed between the mount table 11 and the transport mechanism 17. The front wall 34 includes a plurality of transportation ports A1, A2, A3, and A4 for moving the substrates between the interior of the transport chamber 15 and the exterior of the transport chamber 15 (i.e., the cassettes C). The rear wall 35 is disposed between the transport mechanism 17 and the transport mechanism 22. The rear wall 35 includes a transportation port A5 for moving the substrates between the interior of the transport chamber 15 and the exterior of the transport chamber 15 (i.e., the transport chamber 21). The receiver 19 is disposed in the transportation port A5. The floor 36 is disposed in a downward direction Z(−) of the transport mechanism 17. A rail 37 is disposed on the floor 36 for guiding the transport mechanism 17 in the given direction X.

The transport mechanism 17 includes a base 45, a frame 46, a movable table 47, a link mechanism 48, and a holder arm 49. The base 45 is slidably disposed on the rail 37. The frame 46 is mounted on the base 45. The frame 46 includes a plane (i.e., a Y-Z plane) that is orthogonal to the given direction X and extends from the base 45 in the upward direction Z(+). The frame 46 holds the movable table 47 such that the movable table 47 is movable vertically. The movable table 47 holds a proximal end of the link mechanism 48 such that the link mechanism 48 turns around a vertical axis. The link mechanism 48 expands and contracts in the horizontal direction. The link mechanism 48 includes a front end attached to the holder arm 49. The holder arm 49 holds one substrate W.

The base 45 moves on the rail 37, whereby the transport mechanism 17 is moved in parallel in the given direction X. That is, the base 45, the frame 46, the movable table 47, the link mechanism 48, and the holder arm 49 are integrally moved in parallel in the given direction X. Accordingly, the transport mechanism 17 moves toward a position where the substrate W is transported to the transportation ports A1 to A5 individually. FIG. 2 illustrates the transport mechanism 17 that transports the substrate W to the transportation port A1. At this time, the movable table 47 moves vertically, and the link mechanism 48 turns and expands/contracts, whereby the holder arm 49 accesses the cassette C through the transportation port A1.

The following describes arrangement of the first exhaust fan 41 and the second exhaust fan 42. The first exhaust fan 41 is disposed at a position lower in level than any of the transportation ports A1, A2, A3, and A4. More specifically, the first exhaust fan 41 is disposed at a position lower than a height position H at the lower ends of the transportation ports A1 to A4 (see FIG. 2). In addition, the first exhaust fan 41 is disposed lower in level than the transportation port A5. Similarly, the second exhaust fan 42 is disposed lower in level than any of lower ends of the transportation ports A1 to A5.

In the present embodiment, the first exhaust fan 41 faces to the transport mechanism 17 in the given direction X. More specifically, the first exhaust fan 41 faces to at least any of the base 45, the frame 46, the movable table 47, the link mechanism 48, and the holder arm 49. In other words, assuming that a "range G" denotes an area where the transport mechanism 17 (the entire of the base 45, the frame 46, the movable table 47, the link mechanism 48, and the holder arm 49) is projected on the first wall 31 in the given direction X, the first exhaust fan 41 is disposed in the range G. The range G corresponds to a part of the first wall 31 overlapping any of the base 45, the frame 46, the movable table 47, the link mechanism 48, and the holder arm 49 seen from the given direction X. Similarly, the second exhaust fan 42 faces to the transport mechanism 17.

Figure 4:
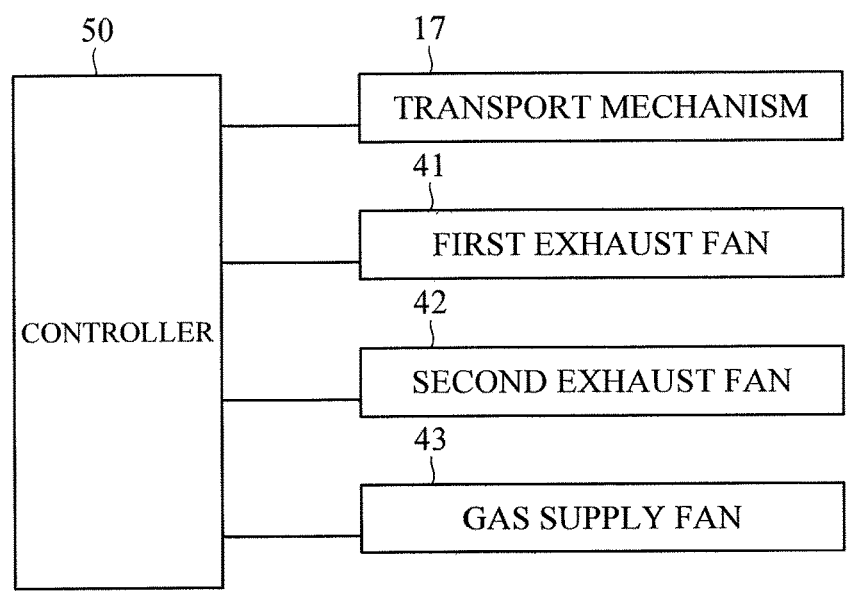
FIG. 4 is a block diagram of control of the substrate transporting device.

Reference is made to FIG. 4. FIG. 4 is a block diagram of control of the substrate transporting device 13. The substrate transporting device 13 includes a controller 50. The controller 50 controls the transport mechanism 17, the first exhaust fan 41, the second exhaust fan 42, and the gas supply fan 43. The controller 47 includes a central processing unit (CPU), a RAM (Random-Access Memory) as a workspace of arithmetic processing, and a storage medium, such as a fixed disk, that stores various types of information, such as transportation recipes or processing recipes set in advance. The transportation recipes define procedures of operation of the transport mechanism 17.

The following simply describes a non-limiting example of operation of the substrate treating apparatus 1 according to the embodiment of the present invention. The transport mechanism 17 transports one substrate W from the cassette C, and places the substrate W on the receiver 19. The transport mechanism 22 transports the substrate W placed on the receiver 19 to the treating unit 23. The treating unit 23 performs treatment to the substrate W. The transport mechanism 22 transports the substrate W from the treating unit 23, and places the substrate W on the receiver 19. The transport mechanism 17 transports the substrate W placed on the receiver 19 into the cassette C. In this manner, a given treatment is performed to the substrate W.

The following describes a non-limiting example of operation of the substrate transporting device 13. The controller 50 controls an exhaust amount (flow rate) of the first and second exhaust fans 41 and 42 as well as a supply amount (flow rate) of the gas supply fan 43 in accordance with a position and a travel direction of the transport mechanism 17.

Figures 5, 6:
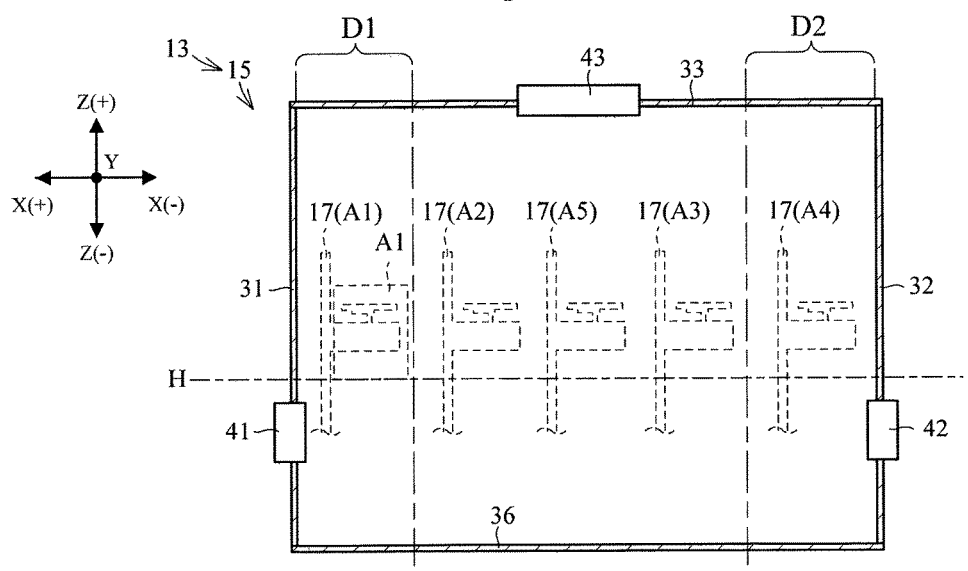
FIG. 5 illustrates an exhaust amount of first and second exhaust fans and a supply amount of a gas supply fan.
FIG. 6 illustrates first and second proximal areas.

FIG. 5 illustrates the exhaust amounts of the first exhaust fan 41 and the exhaust fan 42 and the supply amount of the gas supply fan 43. As illustrated in FIG. 5, operation of the transport mechanism 17 is classified as modes M1 to M9 from the position and the travel direction of the transport mechanism 17.

The following describes in detail the modes M1 to M9.

Mode M1: the transport mechanism 17 is moved toward the first wall 31 in the second proximal area D2.

Mode M2: the transport mechanism 17 is moved toward the first wall 31 out of the first proximal area D1 and the second proximal area D2.

Mode M3: the transport mechanism 17 is moved toward the first wall 31 in the first proximal area D1.

Mode M4: the transport mechanism 17 remains at rest in the first proximal area D1.

Mode M5: the transport mechanism 17 is moved toward the second wall 32 in the first proximal area D1.

Mode M6: the transport mechanism 17 is moved toward the second wall 32 out of the first proximal area D1 and the second proximal area D2.

Mode M7: the transport mechanism 17 is moved toward the second wall 32 in the second proximal area D2.

Mode M8: the transport mechanism 17 remains at rest in the second proximal area D2.

Mode M9: the transport mechanism 17 remains at rest out of the first proximal area D1 and the second proximal area D2.

Here, the position of the transport mechanism 17 is classified as three types as under in accordance with the first proximal area D1 and the second proximal area D2.

1. first proximal area D1
2. second proximal area D2
3. out of first proximal area D1 and second proximal area D2

The following describes a position of the transport mechanism 17 in detail. FIG. 6 illustrates the first proximal area D1 and the second proximal area D2 in the present embodiment. FIG. 6 illustrates positions of the transport mechanisms 17(A1) to 17(A5) by dotted lines when transporting the substrate W to the transportation ports A1 to A5, respectively.

As illustrated, the first proximal area D1 and the second proximal area D2 are each defined in advance within the transport chamber 15. In the present embodiment, the first proximal area D1 is an area whose distance from the first wall 31 in the given direction X is of a given value or less. The second proximal area D2 is an area whose distance from the second wall 32 in the given direction X is of a given value or less. In the present embodiment, the first proximal area D1 does not overlap the second proximal area D2.

Here, the given value that defines the first proximal area D1 may be or may not be equal to the given value that defines the second proximal area D2. It should be noted that the first proximal area D1 contains only a part of a movable area of the transport mechanism 17, and thus does not contain the entire of the movable area of the transport mechanism 17. Similarly, the second proximal area D2 contains only a part of the movable area of the transport mechanism 17, and thus does not contain the entire of the movable area of the transport mechanism 17.

In the present embodiment, the first proximal area D1 contains a transport mechanism 17(A1) that transports a substrate W to the transportation port A1 closest to the first wall 31, and does not contain the other transport mechanisms 17(A2) to 17(A5) that transport substrates W to the transportation ports A2 to A5, respectively, other than the transportation port A1. In other words, the first proximal area D1 contains a position of the transport mechanism 17 when the transport mechanism 17 transports a substrate W to the transportation port A1, and does not contain any positions of the transport mechanism 17 when the transport mechanism 17 transports substrates W to any of the transportation ports A2 to A5.

In the present embodiment, the second proximal area D2 contains a transport mechanism 17(A4) that transports a substrate W to the transportation port A4 closest to the second wall 32, and does not contain the transport mechanisms 17(A1) to 17(A3) and 17(A5) that transport substrates W to the transportation ports A1 to A3 and A5, respectively, other than the transportation port A4. In other words, the second proximal area D2 contains a position of the transport mechanism 17 when the transport mechanism 17 transports a substrate W to the transportation port A4, and does not contain any positions of the transport mechanism 17 when the transport mechanism 17 transports substrates W to any of the transportation ports A1 to A3 and A5.

In the present embodiment, neither the first proximal area D1 nor the second proximal area D2 contains the transport mechanism 17(A2), 17(A3), and 17(A5) that transport substrates W to the transportation port A2, A3, and A5, respectively.

The transport mechanism 17 may entirely be used for classification of the position of the transport mechanism 17. For instance, when the transport mechanism 17 is entirely disposed in the first proximal area D1, it is determinable that the transport mechanism 17 is inside the first proximal area. When at least a part of the transport mechanism 17 is not disposed within the first proximal area D1, it is determinable that the transport mechanism 17 is outside the first proximal area D1. Alternatively, a particular site of the transport mechanism 17 may be used as a position of the transport mechanism 17 for classifying the position of the transport mechanism 17. For instance, when the frame 46 is disposed within the first proximal area D1, it is determinable that the transport mechanism 17 is inside the first proximal area D1. For instance, when the movable table 47 is disposed within the second proximal area D2, it is determinable that the transport mechanism 17 is inside the second proximal area D2.

Moreover, a travel direction of the transport mechanism 17 is classified as three types as under.

1. the first direction X(+)
2. the second direction X(−)
3. no direction (i.e., at rest)

Here, the "first direction X(+)" corresponds to a direction in which the transport mechanism 17 moves toward the first wall 31. The second direction X(−) corresponds to a direction in which the transport mechanism 17 moves toward the second wall 32. The "no direction (i.e. at rest)" is a condition in which transport mechanism 17 remains at rest. FIG. 5 schematically illustrates the travel direction of the transport mechanism 17 by arrows.

The controller 50 controls an exhaust amount of the first exhaust fan 41 at a low flow rate Q1L in the modes M1, M2, and M4 to M9. The controller 50 controls an exhaust amount of the first exhaust fan 41 at a high flow rate Q1H higher than the low flow rate Q1L in the mode M3. The controller 50 controls an exhaust amount of the second exhaust fan 42 at the low flow rate Q2L in the modes M1 to M6, M8, and M9, and controls an exhaust amount of the second exhaust fan 42 at a high flow rate Q2H higher than the low flow rate Q2L in the mode M7. The controller 50 controls a supply amount of the gas supply fan 43 at a flow rate Q3 in all the modes M1 to M9.

The controller 50 performs the control as above, whereby the substrate transporting device 13 operates as under.

If the transport mechanism 17 is moved in the first direction X(+), the first exhaust fan 41 exhausts gas at the low flow rate Q1L (in the modes M1 and M2) when the transport mechanism 17 is outside the first proximal area D1, and the first exhaust fan 41 starts to exhaust the gas at the high flow rate Q1H (in the mode M3) when the transport mechanism 17 enters into the first proximal area D1. Then, when the transport mechanism 17 stops in the first proximal area D1, the first exhaust fan 41 exhausts the gas at the low flow rate Q1L again (in the mode M4). During such a series of operation, the second exhaust fan 42 exhausts gas at the low flow rate Q2L, and the gas supply fan 43 supplies gas at the flow rate Q3. The modes M1 and M2 are one non-limiting example of the first distal approaching step in the present invention. The mode M3 is one non-limiting example of the first proximal approaching step in the present invention.

If the transport mechanism 17 moves toward the second direction X(−), the second exhaust fan 42 exhausts gas at the low flow rate Q2L (in the modes M5 and M6) when the transport mechanism 17 is outside the second proximal area D2, and the second exhaust fan 42 starts to exhaust gas at the high flow rate Q2H (in the mode M7) when the transport mechanism 17 enters into the second proximal area D2. Then, when the transport mechanism 17 stops in the second proximal area D2, the second exhaust fan 42 exhausts the gas at the low flow rate Q2L again (in the mode M8). During such a series of operation, the first exhaust fan 41 exhausts gas at the low flow rate Q1L, and the gas supply fan 43 supplies gas at the flow rate Q3. The modes M5 and M6 are one non-limiting example of the second distal approaching step in the present invention. The mode M7 is one non-limiting example of the second proximal approaching step in the present invention.

As noted above, in the present embodiment, when the transport mechanism 17 moves toward the first wall 31 in the first proximal area D1, the first exhaust fan 41 exhausts a larger amount of gas than that when the transport mechanism 17 moves toward the first wall 31 outside the first proximal area D1. Accordingly, particles can be prevented from floating in the transport chamber 15. This effect is to be described in detail with reference to drawings.

FIG. 7 schematically illustrates a relationship between movement of the transport mechanism 17 and a gas flow. In FIG. 7, the transport mechanism 17 (i.e., the base 45, the frame 46, the movable table 47, the link mechanism 48, and the holder arm 49) is schematically illustrated in one simple figure.

When the transport mechanism 17 moves from a position Pa to a position Pb in the first direction X(+), the transport mechanism 17 pushes gas. More specifically, when the transport mechanism 17 moves in parallel in the first direction X(+), the base 45, the frame 46, the movable table 47, the link mechanism 48, and the holder arm 49 are moved in parallel in the first direction X(+), thereby pushing gas within the transport chamber 15 against the first wall 31. The product of an area of the range G and a moving distance ΔL of the transport mechanism 17 corresponds to a volume V of the gas pushed by the transport mechanism 17. As mentioned above, the range G is obtained by projecting the transport mechanism 17 (the entire of the base 45, the frame 46, the movable table 47, the link mechanism 48, and the holder arm 49) on the first wall 31 in the given direction X.

A part of the gas pushed by the transport mechanism 17 is exhausted outside from the transport chamber 15 through the first exhaust fan 41 disposed on the first wall 31 (more strictly, the range G of the first wall 31). The other part of gas pushed by the transport mechanism 17 is pushed out from a region R between the transport mechanism 17 and the first wall 31 to the other region outside of the transport chamber 15. The gas pushed out from the region R to the other region of the transport chamber 15 circulates within the transport chamber 15. Here, the region R is enclosed with the transport mechanism 17 and the range G, and extends in the given direction X. FIG. 7 schematically illustrates a gas flow Fa exhausted by the first exhaust fan 41 outside of the transport chamber 15, and a gas flow Fb pushed out from the region R to the other region of the transport chamber 15. As illustrated, the gas flow Fb travels from the region R to every direction (e.g., upward Z(+), downward Z(−), frontward Y(+), rearward Y(−)).

Here, the gas pushed out from the region R to the region other than the region R of the transport chamber 15 is denoted by "gas Fb". The following describes the gas Fb. A speed of the gas Fb is generally determined from an amount of gas Fb and a surface area of the region R. It is now assumed that the transport mechanism 17 approaches the first wall 31 and operation thereof is shifted to the modes M1, M2, and M3 in this order. A surface area of the region R becomes smaller as the transport mechanism 17 approaches closer to the first wall 31. If an amount of the gas Fb is constant throughout the modes M1, M2 and M3, a speed of the gas Fb in the mode M2 is higher than the speed of the gas Fb in the mode M1, and the speed of the gas Fb in the mode M3 is higher than the speed of the gas Fb in the mode M2. However, in the present embodiment, the exhaust amount of the first exhaust fan 41 in the mode M3 is larger than that in the modes M1 and M2, respectively. Accordingly, the amount of the gas Fb in the mode M3 is smaller than in the modes M1 and M2, respectively. As a result, relieved speed-up of the gas Fb is obtainable in the mode M3.

FIG. 8A illustrates a speed of the gas pushed out from the region R to the other region in the transport chamber 15 in the comparative example. FIG. 8B illustrates a speed of the gas pushed out from the region R to the other region in the transport chamber 15 in the present embodiment. FIGS. 8A and 8B both include a horizontal axis that represents time. Operation is shifted to the modes M2, M3, and M4 as time elapses.

As illustrated in FIG. 8A, in the comparative example, the exhaust amount of the first exhaust fan 41 in the mode M3 is equal to that in the mode M2. Specifically, the exhaust amount of the first exhaust fan 41 is kept at the low flow rate Q1L from the mode M2 to the mode M3. In such a comparative example, the speed of the gas pushed out from the region R significantly increases at the mode M3.

As illustrated in FIG. 8B, in the present embodiment, the exhaust amount of the first exhaust fan 41 in the mode M3 is larger than that in the mode M2. Specifically, operation is shifted from the mode M2 to the mode M3, the exhaust amount of the first exhaust fan 41 increases from the low flow rate Q1L to the high flow rate Q1H. Such a present embodiment achieves more reduction than the comparative example in speed of the gas pushed out from the region R to the region other than the region R in transport chamber 15 in the mode M3.

As noted above, the present embodiment allows effective suppression of the speed of the gas pushed out from the region R to the other region of the transport chamber 15, leading to elimination of turbulent flow or vortex flow within the transport chamber 15. As a result, particles can be prevented from rolling up within the transport chamber 15.

Similarly, in the present embodiment, when the transport mechanism 17 moves toward the second wall 32 in the second proximal area D2, the exhaust amount of the second exhaust fan 42 becomes larger than that when the transport mechanism 17 moves toward the second wall 32 outside the second proximal area D2. This prevents floating particles within the transport chamber 15.

It is preferred that the first exhaust fan 41 exhausts at least an amount of gas equal to that pushed by the transport mechanism 17 when the transport mechanism 17 moves toward the first wall 31 in the first proximal area D1. In other words, it is preferred that the high flow rate Q1H is equal to or more than the amount of gas pushed by the transport mechanism 17 in unit time in the mode M3. This allows exhaust of the gas pushed out by the transport mechanism 17 in the mode M3 to the exterior of the transport chamber 15 almost entirely. As a result, the amount of gas pushed out from the region R to the other region of the transport chamber 15 is substantially zero, leading to sufficient reduction in speed of the gas pushed out from the region R to the other region of the transport chamber 15. Consequently, floating particles are avoidable.

Similarly, it is preferred that the second exhaust fan 42 exhausts at least an amount of gas equal to that pushed out by the transport mechanism 17 when the transport mechanism 17 moves toward the second wall 32 in the second proximal area D2. This allows avoidance of floating particles.

It is preferred that the transport chamber 15 has a positive pressure when the transport mechanism 17 moves toward the first wall 31 out of the first proximal area D1. For instance, the controller 50 may perform control such that the sum of the low flow rate Q1L of the first exhaust fan 41 and the low flow rate Q2L of the second exhaust fan 42 is smaller than the flow rate Q3 of the gas supply fan 43. This allows a maintained positive pressure within the transport chamber 15, leading to prevention of particles from the exterior to the interior of the transport chamber 15.

Alternatively, the transport chamber 15 may have a positive pressure intentionally also when the transport mechanism 17 moves toward the first wall 31 in the first proximal area D1. For instance, the controller 50 may control a value of the high flow rate Q1H such that the transport chamber 15 has a maintained positive pressure even when the transport mechanism 17 approaches the first wall 31. For instance, the controller 50 may perform control such that the sum of the high flow rate Q1H of the first exhaust fan 41 and the low flow rate Q2L of the second exhaust fan 42 is smaller than the flow rate Q3 of the gas supply fan 43. This allows more sufficient prevention of gas with a low degree of cleanness from entering from the exterior to the interior of the transport chamber 15, leading to efficient elimination of floating particles.

Similarly, it is preferred that the transport chamber 15 has a positive pressure even when the transport mechanism 17 moves toward the second wall 32 outside the second proximal area D2. This prevents the particles from entering from the exterior to the interior of the transport chamber 15.

Similarly, it is preferred that the transport chamber 15 has a positive pressure intentionally also when the transport mechanism 17 moves toward the second wall 32 in the second proximal area D2. This allows more sufficient prevention of gas with a low degree of cleanness from entering from the exterior to the interior of the transport chamber 15, leading to efficient elimination of floating particles.

Moreover, the high flow rate Q1H may be lower than the flow rate Q3 of the gas supply fan 43. This ensures a maintained positive pressure of the transport chamber 15, allowing prevention of a gas with a low degree of cleanness from entering from exterior to the interior of the transport chamber 15. Consequently, more efficient elimination of floating particles is obtainable. Similarly, the high flow rate Q2H may be lower than the flow rate Q3 of the gas supply fan 43. This ensures a maintained positive pressure of the transport chamber 15, allowing prevention of a gas with a low degree of cleanness from entering from the exterior to the interior of the transport chamber 15. Consequently, more efficient elimination of floating particles is obtainable.

In the modes other than the mode M3, the first exhaust fan 41 exhausts gas at the low flow rate Q1L. As mentioned above, since the speed of gas pushed out from the region R to the other region of the transport chamber 15 is lower in the modes M1 and M2 than in the mode M3, sufficient suppression of floating particles is obtainable even at the low flow rate Q1L. In addition, reduction in power consumption of the first exhaust fan 41 is obtainable.

Similarly, in the modes other than the mode M7, the second exhaust fan 42 exhausts gas at the low flow rate Q2L. Consequently, reduction in power consumption of the second exhaust fan 42 is obtainable while floating particles are satisfactorily suppressed.

As mentioned above, the first exhaust fan 41 and the second exhaust fan 42 each exhaust a relatively low amount of gas in almost the modes M1 to M9. Accordingly, the low flow rate Q3 of the gas supply fan 43 is obtainable, leading to reduction in power consumption of the gas supply fan 43.

The first exhaust fan 41 is disposed closer to the first wall 31 than any of the transportation ports A1 to A5. Consequently, the gas pushed out from the region R to the other region of the transport chamber 15 can be prevented from flowing adjacent to the transportation ports A1 to A5.

That is, not only the transportation ports to A2 to A5 but also the transportation port A1, closest to the first wall 31, can be prevented from being subjected to high-speed airflow. As a result, floating particles around any of the transportation ports A1 to A5 are suitably suppressed. Consequently, this prevents the particles from flowing from the interior to the exterior the transport chamber 15 (e.g., to the cassette C) through the transportation ports A1 to A5. Similarly, the second exhaust fan 42 is disposed closer to the second wall 32 than any of the transportation ports A1 to A5. As a result, floating particles around any of the transportation ports A1 to A5 are suitably suppressed. Consequently, this prevents the particles from flowing from the interior to the exterior of the transport chamber 15 through the transportation ports A1 to A5.

The first exhaust fan 41 is disposed lower in level than the transportation ports A1 to A5. Accordingly, the first exhaust unit 41 causes no particle below the transportation ports A1 to A5 to move upward to a level substantially equal to that of the transportation ports A1 to A5. That is, the first exhaust unit does not float the particles up to the level of the transportation ports A1 to A5. Moreover, the first exhaust unit 41 sucks no particles below the transportation ports A1 to A5. As noted above, the first exhaust fan 41 allows effective and appropriate exhaust of the gas in the region R while an atmosphere around the transportation ports A1 to A5 is kept clean. Similarly, the second exhaust fan 42 is disposed lower in level than the transportation ports A1 to A5. Accordingly, the second exhaust unit 42 causes no particle below the transportation ports A1 to A5 to flow up to a level higher than the lower ends of the transportation ports A1 to A5. This allows maintenance of cleaned atmosphere around the transportation ports A1 to A5.

Moreover, the transportation ports A1 to A5 are disposed lower than the gas supply fan 43 and higher than the first exhaust fan 41. Accordingly, cleaned gas supplied from the gas supply fan 43 flows adjacent to the transportation ports A1 to A5 (see FIG. 2). That is, the cleaned gas supplied from the gas supply fan 43 can be supplied around the transportation ports A1 to A5 suitably. This allows maintenance of the cleaned atmosphere around the transportation ports A1 to A5. Similarly, the transportation port A1 to A5 are disposed in a height position between the gas supply fan 43 and the second exhaust fan 42, leading to maintenance of cleaned atmosphere around the transportation ports A1 to A5.

The first exhaust fan 41 faces to the transport mechanism 17, thereby directly exhausting the gas in the region R. This allows effective suppression of the speed of the gas pushed out from the region R. Similarly, the second exhaust fan 42 faces to the transport mechanism 17, thereby allowing effective suppression of the speed of the gas pushed out from the region between the transport mechanism 17 and the second wall 32.

The first proximal area D1 is defined so as to contain the transport mechanism 17 that transports the substrate W to the transportation port A1 closest to the first wall 31, and so as not to contain the transport mechanism 17 that transports the substrate W to the transportation ports A2 to A5 other than the transportation port A1. This allows effective reduction in power consumption of the first exhaust fan 41 while floating particles are suppressed. Similarly, the second proximal area D2 is defined so as to contain the transport mechanism 17 that transports the substrate W to the transportation port A4 closest to the second wall 32, and so as not to contain the transport mechanism 17 that transports the substrate W to the transportation port A1 to A3, and A5 other than the transportation port A4. This allows effective reduction in power consumption of the second exhaust fan 42 while floating particles are suppressed.

The present invention is not limited to the above embodiments, but may be modified as under.

(1) In the embodiments mentioned above, the substrate transporting device 13 includes the second exhaust fan 42. However, this is not limitative. That is, the second exhaust fan 42 is omittable. Such a modification also achieves suitable elimination of floating particles.

(2) In the embodiments mentioned above, the controller 50 performs control so as to start decrease of the exhaust amount of the first exhaust fan 41 to the low flow rate Q1L when the transport mechanism 17 stops movement toward the first wall 31 in the first proximal area D1. However, this is not limitative. For instance, the controller 50 may perform control so as to start decrease of the exhaust amount of the first exhaust fan 41 after a given period elapses from when the transport mechanism 17 stops movement toward the first wall 31 in the first proximal area D1. Such a modification ensures more satisfactory elimination of floating particles.

Similarly, in the embodiments mentioned above, the controller 50 performs control so as to start decrease of the exhaust amount of the second exhaust fan 42 to the low flow rate Q2L when the transport mechanism 17 stops movement toward the second wall 32 in the second proximal area D2. However, this is not limitative. For instance, the controller 50 may perform control so as to start decrease of the exhaust amount of the second exhaust fan 42 after a given period elapses from when the transport mechanism 17 stops movement toward the second wall 32 in the second proximal area D2. Such a modification also ensures more satisfactory elimination of floating particles.

(3) In the embodiments mentioned above, the controller 50 may perform control so as to increase/decrease the high flow rate Q1H of the first exhaust fan 41 in accordance with at least any the position, the speed, and the acceleration of the transport mechanism 17 when the transport mechanism 17 moves toward the first wall 31 in the first proximal area D1. Such a modification allows control of the high flow rate Q1H in accordance with the amount of gas pushed out by the transport mechanism 17 from the region R, leading to more accurate suppression of floating particles.

Similarly, the controller 50 may perform control so as to increase/decrease the high flow rate Q2H of the second exhaust fan 42 in accordance with at least any of the position, the speed, and the acceleration of the transport mechanism 17 when the transport mechanism 17 moves toward the second wall 32 in the second proximal area D2. Such a modification also allows more accurate suppression of floating particles.

(4) In the embodiments mentioned above, the first exhaust fan 41 and the second exhaust fan 42 face to the transport mechanism 17. However, this is not limitative. For instance, the first exhaust fan 41 may be disposed out of the range G (e.g., below the range G). The second exhaust fan 42 may be disposed in the same manner as above. Such a modification also achieves suitable suppression of floating particles.

(5) The embodiment mentioned above describes the first proximal area D1 and the like in detail. However, this is not limitative. A position or a range of the first proximal area D1 is variable appropriately. Similarly, the position or the range of the second proximal area D2 is variable appropriately. For instance, the first proximal area D1 may be defined as under. That is, it may be assumed that the transport mechanism 17 is in the first proximal area D1 when the frame 46 of the transport mechanism 17 is closer to the first wall 31 than to the transportation port A1 closest to the first wall 31, and otherwise it may be assumed that the transport mechanism 17 is outside the first proximal area D1. In other words, a given value by which the first proximal area D1 is defined may be a distance between the first wall 31 and the transportation port A1 closest to the first wall 31. Alternatively, the frame 46 may be used as a positional reference of the transport mechanism 17.

(6) In the embodiments mentioned above, the first exhaust fan 41 is disposed on the first wall 31. However, this is not limitative. The first exhaust fan 41 may be disposed on any of the ceiling 33, the front wall 34, the rear wall 35, and the floor 36 when the first exhaust fan 41 is closer to the first wall 31 than any of the transportation ports A1 to A5. Similarly, the second exhaust fan 42 is disposed on the second wall 32. However, this is not limitative. The second exhaust fan 42 may be disposed on any of the ceiling 33, the front wall 34, the rear wall 35, and the floor 36 when the second exhaust fan 42 is closer to the second wall 32 than any of the transportation ports A1 to A5.

(7) In the embodiments mentioned above, the transport mechanism 17 is movable in parallel in the given direction X. However, this is not limitative. For instance, the transport mechanism 17 may be movable in parallel in the vertical direction Z.

Reference is made to FIG. 9. FIG. 9 illustrates a substrate transporting device 53 according to one modification of the present invention. In the following, like numerals are used to identify like components which are the same as in the embodiment, and the detailed description thereof is to be omitted. The substrate transporting device 53 includes a transport chamber 55 and a transport mechanism 57. The transport mechanism 57 is accommodated in the transport chamber 55. The transport mechanism 57 is movable in parallel in the vertical direction Z. Here, the vertical direction Z is a non-limiting example of the given direction in the present invention.

The transport chamber 55 includes a ceiling 63, a front wall 64, a rear wall 65, and a floor 66. The floor 66 is disposed in the downward direction Z(−) of the transport mechanism 57. The ceiling 63 has an air supply fan 43 attached thereto. The front wall 64 has a transportation port A11 formed therein. A receiver 19 is disposed in the transportation port A11. The substrate transporting device 53 is connected to an external apparatus (e.g., other transport chambers) via the transportation port A11. The rear wall 65 includes a plurality of treating units 23 arranged vertically. The treating units 23 include transportation ports A12, A13, and A14 individually. The transportation port A14 is the closest to the floor 66 among the transportation ports A11 to A14. The floor 66 has a first exhaust fan 41 attached thereto. Moreover, the transport chamber 55 includes a rail 67 that guides the transport mechanism 57 in the vertical direction Z. Here, the floor 66 is one non-limiting example of the first wall in the present invention.

The transport mechanism 57 is movable in parallel in a vertical direction (hereinunder, referred to as a "given direction") Z. The transport mechanism 57 includes a movable table 77, a link mechanism 78, and a holder arm 79. The movable table 77 is slidably attached to the rail 67. The movable table 77 includes an undersurface orthogonally relative to the given direction Z. The movable table 77 rotatably holds the link mechanism 78. The link mechanism 78 holds the holder arm 79.

The movable table 77 moves along the rail 67, whereby the transport mechanism 57 moves in parallel in the given direction Z. That is, the movable table 77, the link mechanism 78, and the holder arm 79 move in parallel integrally in the given direction Z. Accordingly, the transport mechanism 57 moves toward a position in which substrates W are transported to transportation ports A11 to A14 individually.

The first proximal area D1 is defined so as to have a distance from the floor 66 of a given value or less. The first proximal area D1 contains a transport mechanism 57 that transports a substrate W to the transportation port A14, and does not contain the transport mechanism 57 that transports substrates W to transportation ports A11 to A13 individually other than the transportation port A14.

FIG. 10 illustrates an exhaust amount of the first exhaust fan 41 and a supply amount of air supply fan 43. As illustrated, operation of the transport mechanism 17 is classified as six modes M11 to M16 depending on a position and a travel direction of the transport mechanism 17. More specifically, the position of the transport mechanism 57 is classified as two types, i.e., the inside of a first proximal area D1 and the outside of the first proximal area D1. Moreover, the travel direction of the transport mechanism 57 is classified as three types, i.e., a downward direction Z(−), an upward direction Z(+), and at rest. Here, the downward direction Z(−) is directed to the floor 66.

The following describes in detail modes M11 to M16.

Mode M11: the transport mechanism 17 moves toward the floor 66 out of the first proximal area D1.

Mode M12: the transport mechanism 17 moves toward the floor 66 in the first proximal area D1.

Mode M13: the transport mechanism 17 remains at rest in the first proximal area D1.

Mode M14: the transport mechanism 17 moves in the upward direction Z(+) in the first proximal area D1.

Mode M15: the transport mechanism 17 moves toward the upward direction Z(+) out of the first proximal area D1.

Mode M16: the transport mechanism 17 remains at rest out of the first proximal area D1.

The controller 50 controls an exhaust amount of the first exhaust fan 41 to the low flow rate Q1L in the modes M11, and M13 to M16, and controls the exhaust amount of the first exhaust fan 41 to the high flow rate Q1H higher than the low flow rate Q1L in the mode M12. The controller 50 maintains the supply amount of the gas supply fan 43 at a flow rate Q3 in all the modes M11 to M16.

The controller 50 performs control as above, whereby the substrate transporting device 53 operates as under.

When the transport mechanism 57 moves in the downward direction Z(−), the first exhaust fan 41 exhausts gas at the low flow rate Q1L when the transport mechanism 57 is disposed outside the first proximal area D1 (in the mode M11). When the transport mechanism 57 enters into the first proximal area D1, the first exhaust fan 41 starts to exhaust gas at the high flow rate Q1H (in the mode M12). Then, when the transport mechanism 57 stops in the first proximal area D1, the first exhaust fan 41 exhausts gas again at the low flow rate Q1L (in the mode M13). During a series of such operation, the gas supply fan 43 supplies gas at the flow rate Q3. The mode M11 is one non-limiting example of the first distal approaching step in the present invention. The mode M12 is one non-limiting example of the first proximal approaching step in the present invention.

When the transport mechanism 57 moves in the upward direction Z(+), the first exhaust fan 41 exhausts gas at the low flow rate Q1L, and the gas supply fan 43 supplies gas at the flow rate Q3 regardless of the position of the transport mechanism 57 (in the modes M14 and M15).

Such a modification allows suitable suppression of the increased speed of the gas pushed out from the region (see FIG. 9) between the transport mechanism 57 and the floor 66 to the other region of the transport chamber 55. Accordingly, this achieves effective elimination of floating particles.

Moreover, in the modification, the position of the first exhaust fan 41 may be variable appropriately. For instance, the first exhaust fan 41 may be disposed on at least either the front wall 64 or the rear wall 65. Here, it is preferred that the first exhaust fan 41 is disposed at a position closer to the floor 66 than any of the transportation ports A11 to A14. This allows suitable prevention of particles from floating around the transportation ports A11 to 14 when transport mechanism 57 approaches the floor 66 inside the first proximal area D1. Moreover, since the position closer to the floor 66 than any of the transportation ports A11 to A14 is lower than any of the transportation ports A11 to A14, the transport mechanism 57 never causes particles to float up to a height position of the transportation ports A11 to A14.

(8) In the embodiments mentioned above, the controller 50 controls the first exhaust fan 41 and the like in accordance with transportation recipes set in advance. However, this is not limitative. For instance, the substrate transporting device 13 includes a sensor that detects at least any of the position, the speed, and the acceleration of the transport mechanism 17. The controller 50 controls the first exhaust fan 41, the second exhaust fan 42, and the gas supply fan 43 based on detection results by the sensor. Such may be adopted.

(9) In the embodiments mentioned above, the substrate transporting device 13 constitutes the ID section 3. However, this is not limitative. For instance, the substrate transporting device 13 is applicable to an element that constitutes the treating section 5. Alternatively, the substrate transporting device 13 is applicable to an interface section that is disposed between the exposing machine and the treating section 5 for receiving and delivering the substrate W.

(10) In the embodiments mentioned above, the transport mechanism 17 is not necessarily disposed in either the first proximal area D1 or the second proximal area D2. However, this is not limitative. That is, the first proximal area D1 and the second proximal area D2 may be defined such that the transport mechanism 17 is necessarily disposed in either the first proximal area D1 or the second proximal area D2.

(11) In the embodiments mentioned above, the first proximal area D1 does not overlap the second proximal area D2 each other. However, this is not limitative. For instance, the first proximal area D1 and the second proximal area D2 may be defined so as to overlap each other partially.

(12) The present embodiments and the modifications in the above (1) to (11) may be variable appropriately by replacing or combining the elements of the present embodiments or the modifications with the other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate transporting device, comprising:
a transport mechanism that is movable in parallel in a given direction and transports a substrate; and
a transport chamber that accommodates the transport mechanism, the transport chamber comprising:
a first wall disposed on a first side of the given direction of the transport mechanism; and
a plurality of transportation ports each used for moving the substrate between an exterior and an interior of the transport chamber, the substrate transporting device further comprising:
a first exhaust unit that is disposed closer to the first wall than any of the transportation ports, and exhausts gas in the transport chamber outside the transport chamber, and
a controller that controls the transport mechanism and the first exhaust unit, wherein
the controller performs control such that, when the transport mechanism is located in a first proximal area whose distance from the first wall is of a given value or less, and moves toward the first wall, an exhaust amount of the first exhaust unit is larger than that when the transport mechanism is located out of the first proximal area and moves toward the first wall, and
the first proximal area is defined so as to contain the transport mechanism when the transport mechanism transports the substrate to one of the transportation ports that is the closest to the first wall, and so as not to contain the transport mechanism when the transport mechanism transports the substrate to any of the transportation ports other than the transportation port that is the closest to the first wall.

2. The substrate transporting device according to claim 1, wherein
the first exhaust unit exhausts at least an amount of gas pushed out by the transport mechanism when the transport mechanism moves toward the first wall in the first proximal area.

3. The substrate transporting device according to claim 1, wherein
the first exhaust unit is disposed on the first wall, and is disposed lower in level than the transportation ports.

4. The substrate transporting device according to claim 1, wherein
the controller performs control such that the transport chamber has a positive pressure also when the transport mechanism moves toward the first wall in the first proximal area.

5. The substrate transporting device according to claim 4, further comprising:
a gas supply unit that supplies gas to the transport chamber, wherein
the controller controls the gas supply unit, and
the controller performs control such that an exhaust amount of the first exhaust unit is smaller than a supply amount of the gas supply unit also when the transport mechanism moves toward the first wall in the first proximal area.

6. The substrate transporting device according to claim 1, wherein
the given direction is a horizontal direction.

7. The substrate transporting device according to claim 1, wherein
the given direction is a vertical direction.

8. The substrate transporting device according to claim 1, wherein
the transport chamber is disposed adjacent to a mount table that places a substrate container thereon that accommodates the substrates, and the transport mechanism transports the substrates individually to the substrate container placed on the mount table through the transportation ports.

9. A substrate treating apparatus, comprising:
the substrate transporting device of claim 1; and
a treating unit that performs treatment to the substrate.

10. A substrate transporting method for moving a transport mechanism in parallel in a transport chamber, having a plurality of transportation ports formed therein, toward a first wall of the transport chamber, the substrate transporting method comprising:
a first proximal approaching step of locating the transport mechanism in a first proximal area whose distance from the first wall is of a given value or less, and moving the transport mechanism toward the first wall; and
a first distal approaching step of locating the transport mechanism out of the first proximal area and moving the transport mechanism toward the first wall, wherein
in the first proximal approaching step and the first distal approaching step, a first exhaust unit is disposed closer to the first wall than any of the transportation ports, and exhausts gas in the transport chamber,
an exhaust amount of the first exhaust unit is larger in the first proximal approaching step than that in the first distal approaching step, and
the first proximal area is defined so as to contain the transport mechanism when the transport mechanism transports the substrate to one of the transportation ports that is the closest to the first wall, and so as not to contain the transport mechanism when the transport mechanism transports the substrate to any of the transportation ports other than the transportation port that is the closest to the first wall.

11. A substrate transporting device, comprising:
a transport mechanism that is movable in parallel in a given direction and transports a substrate; and
a transport chamber that accommodates the transport mechanism, the transport chamber comprising:
a first wall disposed on a first side of the given direction of the transport mechanism;
a second wall disposed on a second side of the given direction of the transport mechanism; and
a plurality of transportation ports each used for moving the substrate between an exterior and an interior of the transport chamber, the substrate transporting device further comprising:
a first exhaust unit that is disposed closer to the first wall than any of the transportation ports, and exhausts gas in the transport chamber outside the transport chamber,
a second exhaust unit that is disposed closer to the second wall than any of the transportation ports, and exhausts gas in the transport chamber outside the transport chamber,
a controller that controls the transport mechanism and the first exhaust unit and the second exhaust, wherein
the controller performs control such that, when the transport mechanism is located in a first proximal area whose distance from the first wall is of a given value or less, and moves toward the first wall, an exhaust amount of the first exhaust unit is larger than that when the transport mechanism is located out of the first proximal area and moves toward the first wall, and
the controller performs control such that, when the transport mechanism is located in a second proximal area whose distance from the second wall is of a given value or less, and moves toward the second wall, an exhaust amount of the second exhaust unit is larger than that when the transport mechanism is located out of the second proximal area and moves toward the second wall.

12. The substrate transporting device according to claim 11, wherein
the first exhaust unit exhausts at least an amount of gas pushed out by the transport mechanism when the transport mechanism moves toward the first wall in the first proximal area.

13. The substrate transporting device according to claim 11, wherein
the first exhaust unit is disposed on the first wall, and is disposed lower in level than the transportation ports.

14. The substrate transporting device according to claim 11, wherein
the controller performs control such that the transport chamber has a positive pressure also when the transport mechanism moves toward the first wall in the first proximal area.

15. The substrate transporting device according to claim 14, further comprising:
a gas supply unit that supplies gas to the transport chamber, wherein
the controller controls the gas supply unit, and
the controller performs control such that an exhaust amount of the first exhaust unit is smaller than a supply amount of the gas supply unit also when the transport mechanism moves toward the first wall in the first proximal area.

16. The substrate transporting device according to claim 11, wherein
the second exhaust unit exhausts at least an amount of gas pushed out by the transport mechanism when the transport mechanism moves toward the second wall in the second proximal area.

17. The substrate transporting device according to claim 11, wherein
the second exhaust unit is disposed on the second wall, and is disposed lower in level than the transportation ports.

18. The substrate transporting device according to claim 11, wherein
the second proximal area is defined so as to contain the transport mechanism when the transport mechanism transports the substrate to one of the transportation ports that is the closest to the second wall, and so as not to contain the transport mechanism when the transport mechanism transports the substrate to any of the transportation ports other than the transportation port that is the closest to the second wall.

19. The substrate transporting device according to claim 11, wherein
the controller performs control such that the transport chamber has a positive pressure also when the transport mechanism moves toward the second wall in the second proximal area.

20. The substrate transporting device according to claim 19, further comprising:
a gas supply unit that supplies gas to the transport chamber, wherein
the controller controls the gas supply unit, and
the controller performs control such that the sum of an exhaust amount of the first exhaust unit and an exhaust amount of the second exhaust unit is smaller than a supply amount of the gas supply unit also when the transport mechanism moves toward the second wall in the second proximal area.

21. The substrate transporting device according to claim 20, wherein
the controller performs control such that the exhaust amount of the second exhaust unit is smaller than a supply amount of the gas supply unit also when the transport mechanism moves toward the second wall in the second proximal area.

22. The substrate transporting device according to claim 20, wherein
the controller performs control such that the exhaust amount of the second exhaust unit is kept constant and the supply amount of the gas supply unit is kept constant when the transport mechanism moves toward the first wall.

23. The substrate transporting device according to claim 11, wherein
the given direction is a horizontal direction.

24. The substrate transporting device according to claim 11, wherein
the given direction is a vertical direction.

25. The substrate transporting device according to claim 11, wherein
the transport chamber is disposed adjacent to a mount table that places a substrate container thereon that accommodates the substrates, and the transport mechanism transports the substrates individually to the substrate container placed on the mount table through the transportation ports.

26. A substrate treating apparatus, comprising:
the substrate transporting device of claim 11; and
a treating unit that performs treatment to the substrate.

27. A substrate transporting method for moving a transport mechanism in parallel in a transport chamber, having a plurality of transportation ports formed therein, toward a first wall and a second wall of the transport chamber, the substrate transporting method comprising:
a first proximal approaching step of locating the transport mechanism in a first proximal area whose distance from the first wall is of a given value or less, and moving the transport mechanism toward the first wall;
a first distal approaching step of locating the transport mechanism out of the first proximal area and moving the transport mechanism toward the first wall;
a second proximal approaching step of locating the transport mechanism in a second proximal area whose distance from the second wall is of a given value or less, and moving the transport mechanism toward the second wall; and
a second distal approaching step of locating the transport mechanism out of the second proximal area and moving the transport mechanism toward the second wall, wherein
the first wall is disposed on a first side of the transport mechanism;
the second wall is disposed on a second side of the transport mechanism,
in the first proximal approaching step and the first distal approaching step, a first exhaust unit is disposed closer to the first wall than any of the transportation ports, and exhausts gas in the transport chamber, an exhaust amount of the first exhaust unit is larger in the first proximal approaching step than that in the first distal approaching step,
in the second proximal approaching step and the second distal approaching step, a second exhaust unit is disposed closer to the second wall than any of the transportation ports, and exhausts gas in the transport chamber, and
an exhaust amount of the second exhaust unit is larger in the second proximal approaching step than that in the second distal approaching step.

* * * * *